US012638534B2

(12) United States Patent
Feiweier et al.

(10) Patent No.: US 12,638,534 B2
(45) Date of Patent: May 26, 2026

(54) METHOD FOR REDUCING ARTIFACTS IN IMAGE DATA RECONSTRUCTED FROM MEASUREMENT DATA OF AN OBJECT UNDER EXAMINATION CAPTURED USING AN ECHO-PLANAR ACQUISITION TECHNIQUE (EPI)

(71) Applicant: Siemens Healthineers AG, Forchheim (DE)

(72) Inventors: Thorsten Feiweier, Poxdorf (DE); Mario Zeller, Erlangen (DE); Adam Kettinger, Erlangen (DE); Michael Köhler, Nuremberg (DE); Max Müller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 209 days.

(21) Appl. No.: 18/664,678

(22) Filed: May 15, 2024

(65) Prior Publication Data

US 2024/0385272 A1 Nov. 21, 2024

(30) Foreign Application Priority Data

May 17, 2023 (DE) ..................... 10 2023 204 639.3

(51) Int. Cl.
*G01R 33/56* (2006.01)
*G01R 33/483* (2006.01)
(Continued)

(52) U.S. Cl.
CPC ... *G01R 33/56554* (2013.01); *G01R 33/4835* (2013.01); *G01R 33/5611* (2013.01); *G01R 33/5616* (2013.01)

(58) Field of Classification Search
CPC .......... G01R 33/56554; G01R 33/4835; G01R 33/5611; G01R 33/5616
See application file for complete search history.

(56) References Cited

U.S. PATENT DOCUMENTS 6,043,651 A 3/2000 Heid
9,329,254 B2 5/2016 Pfeuffer
(Continued)

FOREIGN PATENT DOCUMENTS

DE 102010012948 B4 4/2012
DE 102016200889 B4 2/2018
DE 102018216774 A1 4/2020

OTHER PUBLICATIONS

Zahneisen, Benjamin et al. "Three-Dimensional Fourier Encoding of Simultaneously Excited Slices: Generalized Acquisition and Reconstruction Framework," Magnetic Resonance in Medicine, vol. 71, No. 6, pp. 2071-2081, Jun. 2014 // https://doi.org/10.1002/mrm. 24875.

(Continued)

*Primary Examiner* — G.M. A. Hyder

(74) *Attorney, Agent, or Firm* — Banner & Witcoff, Ltd.

(57) ABSTRACT

Techniques are described for complex preprocessing steps to ensure consistency of sorted sets of reference measurement data, which have conventionally been required when sorting reference measurement data sets for DPG algorithms captured using an EPI technique, to be omitted because items of reference measurement data captured via the described techniques are already consistent in themselves. Therefore, for each polarity of the read-out gradients, a set of fully sampled reference measurement data is available, which is already suitable for carrying out a dual-polarity (DP) algorithm without any further measures.

17 Claims, 4 Drawing Sheets

(51) Int. Cl.
  *G01R 33/561* (2006.01)
  *G01R 33/565* (2006.01)

(56) References Cited

U.S. PATENT DOCUMENTS

| | | |
|---|---|---|
| 2011/0234221 A1 | 9/2011 | Feiweier |
| 2017/0212196 A1 | 7/2017 | Feiweier et al. |
| 2020/0103484 A1 | 4/2020 | Zeller |
| 2024/0219500 A1* | 7/2024 | Zeller .................. G01R 33/243 |

OTHER PUBLICATIONS

Pruessmann K. et al., "SENSE: Sensitivity Encoding for Fast MRI", Magnetic Resonance in Medicine 42:952-962 (1999).

Hoge, W. S. et al.: "Dual-Polarity GRAPPA for Simultaneous Reconstruction and Ghost Correction of Echo Planar Imaging Data", Magnetic Resonance in Medicine, 2016, 76:32-44, 32 pages; 2016.

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005); 2005.

Setsompop, K. et al.: "Blipped-Controlled Aliasing in Parallel Imaging for Simultaneous Multislice Echo Planar Imaging with Reduced g-Factor Penalty", in: Magnetic Resonance in Medicine; vol. 67; pp. 1210-1224; 2012.

Polimeni, J. R. et al. "Reducing Sensitivity Losses Due to Respiration and Motion in Accelerated Echo Planar Imaging by Reordering the Autocalibration Data Acquisition", Magnetic Resonance in Medicine; vol. 75; pp. 665-679; 2016.

Griswold M. et al.: "Generalized Autocalibrating Partially Parallel Acquisitions (GRAPPA)", Magnetic Resonance in Medicine, vol. 47, pp. 1202-1210, 2002 // DOI 10.1002/mrm.10171.

* cited by examiner

FIG 1

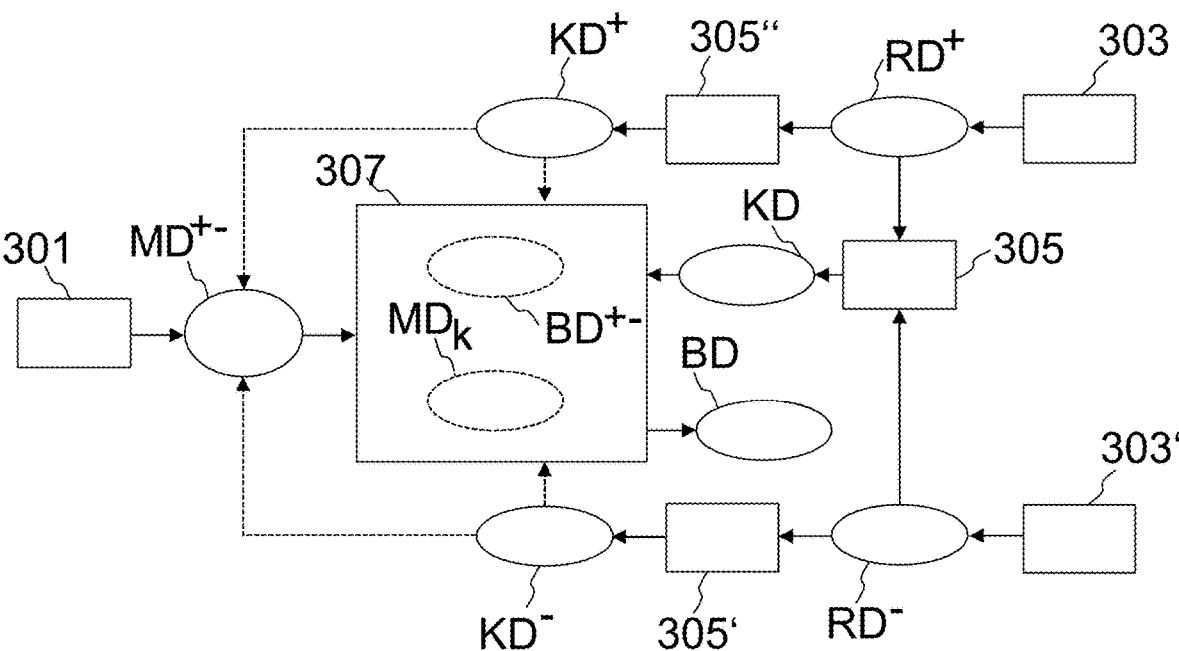

301: Acquire measurement data MD+- from captured echo signals
303: Capture a first set of reference measurement data RD+
303': Capture a second set of reference measurement data RD-
305: Determine calibration data KD
305': Determine second calibration data KD-
305": Determine first calibration data KD+
307: Use calibration data KD, KD+, KD- to correct artifacts in image data BD of at least
one slice reconstructed from the measurement data MD+-

METHOD FOR REDUCING ARTIFACTS IN IMAGE DATA RECONSTRUCTED FROM MEASUREMENT DATA OF AN OBJECT UNDER EXAMINATION CAPTURED USING AN ECHO-PLANAR ACQUISITION TECHNIQUE (EPI)

CROSS-REFERENCE TO RELATED APPLICATIONS

The present application claims priority to and the benefit of German patent application no. DE 10 2023 204 639.3, filed on May 17, 2023, the contents of which are incorporated herein by reference in their entirety.

TECHNICAL FIELD

The disclosure relates to a method for reducing artifacts in image data reconstructed from measurement data of an object under examination captured using an EPI acquisition technique.

BACKGROUND

Magnetic resonance (MR) technology is a known technology with which images of the interior of an object under examination can be produced. In simple terms, the object under examination is to this end positioned in a magnetic resonance imager in a comparatively strong static, homogeneous main magnetic field, also known as B0 field, with field strengths of 0.2 tesla to 7 tesla and higher, such that the nuclear spins thereof are oriented along the main magnetic field. In order to trigger nuclear spin resonances which are measurable as signals, radio-frequency excitation pulses (RF pulses) are irradiated into the object under examination, and the triggered nuclear spin resonances are measured as "k-space data" and used as the basis for reconstructing MR images or ascertaining spectroscopic data. Rapidly switched magnetic gradient fields, or gradients for short, are overlaid on the main magnetic field in order to spatially encode the measurement data. An applied scheme which describes a time sequence of RF pulses to be irradiated and gradients to be switched is known as a pulse sequence (scheme), or also sequence for short. The recorded measurement data is digitized and saved as complex numerical values in a k-space matrix. On the basis of the k-space matrix populated with values, it is possible to reconstruct an associated MR image, for example using a multi-dimensional Fourier transform.

SUMMARY

In recent years, the practice of accelerating MR measurements by deliberate undersampling of k-space, for example by "parallel" acquisition techniques, has become established. Examples of the stated parallel acquisition techniques (ppa techniques) which can be used to shorten the acquisition times required for capturing the desired data by incomplete Nyquist sampling, i.e., undersampling, of k-space, include GRAPPA ("GeneRalized Autocalibrating Partially Parallel Acquisition") and SENSE ("SENSitivity Encoding"). In parallel acquisition techniques, the measurement points in k-space which are not measured in the course of undersampling are generally uniformly distributed over the k-space to be measured according to Nyquist, such that for example every second k-space line is measured. Additionally, the "missing" k-space data in parallel acquisition techniques is reconstructed with the assistance of coil sensitivity data. This coil sensitivity data from the receive coils used during capture of the measurement data is determined from reference measurement data which fully samples at least one region, usually the central region, of the k-space to be measured, according to the Nyquist condition. Any measurement data from which image data is not (or not only) reconstructed but which is instead used as a reference for determining further information for a technique or algorithm used is designated reference measurement data in this document.

One of the fastest known MR capture techniques is "echo-planar" imaging (EPI) in which an RF excitation pulse is followed by an oscillating, i.e., bipolar, read-out gradient which, on every change in polarity of the gradient, refocuses the transverse magnetization as far as T2* decay permits, and thus in each case generates a gradient echo. In other words, an echo train of rising and falling gradient echoes with alternating signs is generated by switching the bipolar read-out gradient after an RF excitation pulse within the free induction decay (FID) after excitation, or additionally irradiating an RF refocusing pulse after the RF excitation pulse within the spin echo generated in this manner. EPI pulse sequences may be used as a "single-shot" method in which all the measurement data for imaging a sub-volume, for example a slice, of the examined object under examination is captured after just one RF excitation pulse. "Multi-shot" methods are also known which sample the k-space to be captured in various segments, for example per "shot".

In addition to reducing the duration of measurement, parallel acquisition techniques offer further advantages depending on the MR imaging technique used. For example, in EPI acquisition techniques, it is possible to reduce the length of the read-out train, e.g. in the course of functional magnetic resonance imaging (fMRI) captures for determining diffusion characteristics ("Diffusion-Weighted Imaging" (DWI)) or for perfusion measurements. The echo time of the captured echo signals can consequently be reduced, so resulting in a higher signal-to-noise ratio (SNR). Greater bandwidth along the phase-encoding direction can moreover be achieved, so reducing distortion. Furthermore, shortening the length of the read-out train in this way can reduce the impact of T2* relaxation on the captured signals, resulting in the obtaining of sharper images.

Undersampling factors in the range from 2-4 are typically used in routine clinical practice, with in-plane undersampling often being combined with a simultaneous multi-slice (SMS) capture.

Such methods in which images from various slices are captured simultaneously can generally be characterized in that, at least during part of the measurement, the transverse magnetization of at least two slices is simultaneously deliberately utilized for the imaging process ("multi-slice imaging", "slice multiplexing"). In contrast, in established "multi-slice imaging", the signal from at least two slices is captured alternately, i.e., completely mutually independently with a correspondingly longer measurement time.

Such known methods, which are also known as simultaneous multi-slice (SMS) methods, are for example "Hadamard encoding", methods with simultaneous echo-refocusing, methods with broadband data capture or indeed methods using parallel imaging in the slice direction. The latter-stated methods also include, for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691 and the blipped CAIPIRINHA technique, as described by Setsompop et al.

in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

For instance, the latter-stated slice multiplexing methods use a "multi-band" RF pulse to excite or otherwise manipulate, for example refocus or saturate, two or more slices simultaneously. Such a multi-band RF pulse is here for example a multiplex of individual RF pulses which would be used for manipulating the individual slices which are simultaneously to be manipulated. Multiplexing for example gives rise to a baseband-modulated multi-band RF pulse by adding together the pulse shapes of the individual RF pulses. Spatial encoding of the captured signals within the slices is here substantially achieved by conventional gradient switching in two directions (two-dimensional gradient encoding).

The resultant signals from all the excited slices are captured in a collapsed form in a data set using a plurality of receive antennas and then divided into the individual slices. For example, with the assistance of parallel acquisition techniques as stated above.

The algorithms with which the captured signals can be separated back out and assigned to the individual slices are based on the availability of further information from which the spatial sensitivity of the receive antennas (sensitivity data) is determined, such information generally being determined from reference measurement data. Such sensitivity data is used, in addition to spatial encoding by the gradient fields, as additional spatial encoding with which the desired signal assignment is achieved by solving equation systems using iterative methods or using trained networks.

Parallel acquisition techniques may be used in slice multiplexing methods to separate back out the measurement data captured simultaneously for various slices and thus in collapsed form. Reference measurement data here has to be captured for all the slices involved. This generally takes place in the course of a reference measurement which is to be additionally carried out and individually measures the reference measurement data for each desired slice.

In order to allow the resultant signals from the various slices to be separated, a different phase is for example impressed onto the individual RF pulses prior to multiplexing. This may for example be carried out by adding a phase which rises linearly (for example with the k-space coordinates in the phase-encoding direction (ky)). A different phase rise can thus be impressed on each slice, whereby the slices are shifted relative to one another in the image space. This shift is controlled by the "field of view (FOV) shift factor". DE 10 2016 218955, for example, describes how an optimum FOV shift factor can be determined.

In the CAIPIRINHA methods described in the stated articles by Breuer et al. and Setsompop et al., alternating further phase shifts, which produce shifts in the image space in the slice direction ("interslice FOV shifts"), are impressed between the simultaneously excited slices by switching additional gradient blips or by additionally modulating the phases of the RF pulses on the multi-band RF pulses. These additional shifts in the image space improve the quality of separation of the signals from the slices, for example using the slice-GRAPPA method mentioned in the article by Breuer et al., e.g. if the coil sensitivities have such small differences in the sensitivity profiles of the individual coils which are used that the latter are insufficient for reliably separating the slices. Artifacts in the image data ultimately reconstructed from the measured measurement data are thus reduced.

The effect of the additional phase shifts on the sampling scheme of a two-dimensional (2D) slice multiplexing measurement can be described as follows: the additional phases which are impressed in the slice multiplexing CAIPIRINHA method shift the measurement points to which the additional phase has been applied by a shift in k-space in the kz direction. The size of this shift in the kz direction depends on the impressed phase. This is, for example, also described in the article by Zahneisen et al.: "Three-Dimensional Fourier Encoding of Simultaneously Excited Slices: Generalized Acquisition and Reconstruction Framework", Magn. Reson. Med. 71, pp. 2071-2081 (2014).

The reference measurement data from which sensitivity data for separating the simultaneously captured slices is obtained (slice separation reference measurement data) is generally additionally measured for each slice multiplexing measurement.

It must furthermore be borne in mind in EPI acquisition techniques that, due to the alternating polarity of the read-out gradient with which the echo signals are captured as measurement data, even small asymmetries in the measurement data captured in this manner result in inconsistencies in the k-space data and consequently in unwanted replicas (also known as "(N/2) ghosts") in the image data. Such asymmetries may for example be the consequence of dynamic interference fields (for example due to induced eddy currents on switching gradient fields).

This arises because the measurement data obtained from the echo signals captured using EPI are sorted into a raw data k-space matrix in such a way that the sorting direction of the raw data k-space matrix alternates from line to line. If even slight differences arise from line to line, for example due to delays in gradient switching or eddy currents, this results in "(N/2) ghosts", i.e., in an image matrix of N×N points, the actual image is imaged once again, and specifically in general with a different intensity, shifted by N/2 in the positive and negative direction relative to the center of the image matrix. In order to correct such (N/2) ghosts, it is known for example from U.S. Pat. No. 6,043,651, to capture three navigator signals while switching a bipolar read-out gradient, which navigator signals can be used for the correction of zeroth and first order phase shifts between gradient echoes captured with different polarity in the read-out direction, and which correction can correct such shifts. To this end, correlation of the captured navigator signals in the image space is used to determine correction factors which, on reconstruction of image data from the gradient echoes captured as measurement data in a raw data k-space matrix, can be used to correct the stated shifts in the raw data k-space matrix. The appearance of the ghosts may depend on a selected level of undersampling. With an undersampling factor PAT=2, i.e., half of the measurement data to be captured according to Nyquist is actually captured, asymmetries lead, for example, to N/4 ghosts.

A further phase correction method, known as DORK, for correcting shifts, for example a drift caused by temporal variations in a main magnetic field applied during an EPI measurement in which method a navigator signal is captured, is known for example from U.S. Pat. No. 9,329,254. Averaging is conventionally performed over an entire image volume during such a DORK correction.

A further phase correction method is known from German patent application no. DE 10 2010 012948.

Such known correction methods generally manage to reduce asymmetries in the measurement data measured for imaging purposes and, if this data is likewise captured using EPI, also in reference measurement data to such an extent that the impression of residual ghosts in their image data (image ghosts) no longer plays any real role in clinical diagnostics.

However, such correction methods based on one-dimensional navigator signals can come up against their limits, e.g. when the interference fields causing the inconsistencies have spatial variations not only along the read-out direction. While the intensity of image ghosts is then still reduced, image artifacts that may limit clinical usability do nevertheless remain.

A dual-polarity GRAPPA (DPG) technique described for example in the article by Hoge et al., "Dual-Polarity GRAPPA for Simultaneous Reconstruction and Ghost Correction of Echo Planar Imaging Data", Magn. Reson. Med. 76: pp. 32-44, 2016, successfully reduces the intensity of image ghosts, even in the case of complex interference field geometries, to such an extent that the images are entirely suitable for clinical diagnosis.

In its original form, an algorithm used in DPG simultaneously reduces image ghosts and supplements k-space data that is missing because of the GRAPPA technique used. Modified variants are, however, also capable of reducing only the asymmetries in the measurement data captured in k-space with positive or negative read-out gradients, such that image ghosts can also be reduced for fully sampled measurement data for imaging and/or for alternative reconstruction methods (for example DL-based supplementation of missing k-space data).

One drawback of the DPG approach is, however, that it requires further reference measurement data that extends the overall duration of data capture due to the further capture of reference measurement data.

A number of methods for capturing reference measurement data for the application of a DPG algorithm are known. A feature common to all methods is that two sets of reference measurement data, in each case with inverted polarity of the read-out gradients, are necessarily captured.

For example, it is known to capture reference measurement data for a DPG algorithm using a single-shot EPI capture technique in which, for each slice in which measurement data is captured for imaging, reference measurement data is captured after each excitation using an EPI capture technique. The contrast of the reference measurement data may here deviate from a respective contrast of the measurement data captured for imaging, for example because a shorter repetition time TR was selected for capturing the reference measurement data than for capturing the measurement data for imaging to reduce the duration of the measurement time required for capturing the reference measurement data. In a second (separate) measurement, reference measurement data is captured with inverted read-out gradients.

Such reference measurement data for DPG algorithms captured with a single-shot EPI capture technique is robust against the effects of possible (physiological) movements of an examined object under examination if the captures of the two sets of reference measurement data performed with differently polarized read-out gradients take place with the least possible time lag between them. The single-shot variant of the EPI technique here means that only a moderate measurement time may be sufficient to capture both sets of reference measurement data, although fat-suppression modules may optionally have to be switched. Unfortunately, the quality of such reference measurement data captured using a single-shot EPI capture technique is furthermore greatly reduced by distortion arising due to nonuniformities in the main magnetic field B0 and by possible residual fat signals, each of which have a negative impact on the applied DPG algorithm. Furthermore, such sets of reference measurement data for a DPG algorithm captured in this manner are at best moderately consistent with the measurement data captured for imaging, since there is in each case a differing signal phase evolution as a function of the k-space line in the reference measurement data captures, on the one hand, and the measurement data captures for imaging, on the other.

It is furthermore known to capture reference measurement data for DPG algorithms using a multi-shot EPI capture technique in which the reference measurement data for each slice for which measurement data is to be captured for imaging is captured with a plurality of excitations of a segmented EPI capture technique. Here too, the contrast of the reference measurement data may deviate from a respective contrast of the measurement data captured for imaging, for example if a shorter repetition time TR is selected for the reference measurement data captures in order to reduce the overall duration of measurement. Reference measurement data with inverted read-out gradients is again captured in second measurements.

Reference measurement data for a DPG algorithm may be captured with a multi-shot EPI capture technique using conventional segmentation in which the k-space to be captured is subdivided into segments from which reference measurement data is captured after each excitation. The reference measurement data is here captured from the individual segments in each case after an extended relaxation time with a consequently relatively large time lag between the individual excitations, but with an identical flip angle, whereby the items of reference measurement data from all the segments then implicitly have a comparable contrast with one another.

In this manner, it is possible to achieve a high level of consistency of the reference measurement data with the measurement data for imaging likewise captured using an EPI capture technique. However, long measurement times have to be accepted for this, especially if fat-suppression modules have to be switched (as they generally do). Reference measurement data for a DPG algorithm captured using a multi-echo EPI capture technique are likewise sensitive to the effects of (physiological) movements of the examined object under examination. Unfortunately, the quality of such reference measurement data captured for a DPG algorithm using a multi-shot EPI capture technique is furthermore greatly reduced by distortion arising due to nonuniformities in the main magnetic field B0 and by possible residual fat signals, each of which have a negative impact on the DPG algorithm.

Reference measurement data for a DPG algorithm may also be captured with a multi-shot EPI capture technique using a "FLEET" technique ("fast low-angle excitation echo-planar technique"), as described, for example, in the article by Polimeni et al. "Reducing Sensitivity Losses Due to Respiration and Motion in Accelerated Echo Planar Imaging by Reordering the Autocalibration Data Acquisition", Magn. Reson. Med. 75, pp. 665-679, 2016, and in which the reference measurement data of the individual segments is captured in a short time sequence. The flip angle of the respective excitation is here varied between the various segments in order to ensure they have similar contrast, it being possible, however, for unwanted variations in contrast between the segments to remain.

Also, in this manner (multi-shot EPI with FLEET), it is possible to achieve a high level of consistency of the reference measurement data with the measurement data for imaging likewise captured using an EPI capture technique, it being possible, due to FLEET reducing the duration of capture of the reference measurement data, to achieve a reduction in the sensitivity of the reference measurement data to effects of (physiological) movements of the examined object under examination. Nevertheless, the measurement times required for capturing both sets of reference measurement data for a DPG algorithm using a multi-shot EPI capture technique with FLEET are still undesirably long, e.g. due to fat-suppression modules which are to be switched. Unfortunately, the quality of such reference measurement data captured for a DPG algorithm using a multi-shot EPI capture technique is furthermore greatly reduced by distortion arising due to nonuniformities in the main magnetic field B0 and by possible residual fat signals, each of which have a negative impact on the DPG algorithm.

In addition, when it comes to reference measurement data for a DPG algorithm, the two sets of reference measurement data captured with inverted polarities of the read-out gradients have to be combined before carrying out the actual DPG algorithm in such a way that, in each case, a fully sampled set of sorted reference measurement data is obtained with just one read-out direction in each case, i.e., only with a positive polarity of the read-out gradient or only with a negative polarity of the read-out gradient. Since, even in the case of sets of reference measurement data captured using single-shot EPI, both sets of reference measurement data are captured with a time lag, it is entirely possible that, for example, movements of the object under examination (including physiological, such as breathing, heartbeat, (blood) flow, peristalsis etc.), or indeed changes in ambient conditions, such as for example fluctuations in the main magnetic field B0, will cause difficult-to-correct inconsistencies between the two captured sets of reference measurement data. Since remaining errors in the combined sorted sets of reference measurement data can lead to artifacts in the images generated by the DPG algorithm, this preprocessing and sorting must be carried out with care and can therefore involve relatively significant effort if such inconsistencies occur.

The object of the present disclosure is to enable rapid and robust capture of two sets of reference measurement data, which were captured with an inverted polarity of the read-out gradients used and which are suitable for use in the course of a DGP algorithm.

Said object is achieved by a method for reducing artifacts in image data reconstructed from measurement data of an object under examination captured using an echo-planar acquisition technique (EPI) as described herein, including the claims and the description of a magnetic resonance system, a computer program, and an electronically readable data storage medium.

A method according to the disclosure for reducing artifacts in image data reconstructed from measurement data of an object under examination captured using an EPI acquisition technique comprises the steps of:

loading measurement data which was generated by generating a train of at least two echo signals from at least one slice of the object under examination in each case after an RF excitation pulse and capturing the echo signals while switching read-out gradients with alternating polarity for successive echo signals and acquiring captured echo signals as measurement data, capturing for the at least one slice a first set of reference measurement data for reducing artifacts using a gradient echo (GRE) acquisition technique, wherein the reference measurement data of the first set of reference measurement data is captured after a plurality of excitations with different phase-encoding and in each case while switching identically configured read-out gradients which have a first polarity, capturing for the at least one slice a second set of reference measurement data for reducing artifacts using a GRE acquisition technique, wherein the reference measurement data of the second set of reference measurement data is captured after a plurality of excitations with a different phase-encoding scheme and in each case while switching identically configured read-out gradients which have a second polarity differing from the first polarity, determining calibration data on the basis of captured first sets of reference measurement data and on the basis of captured second sets of reference measurement data, correcting artifacts in image data reconstructed from the measurement data and caused by errors in the measurement data by applying the first calibration data and the second calibration data in the course of a dual-polarity (DP) algorithm, saving and/or further processing the corrected measurement data and/or image data.

The DP algorithm may be a dual-polarity algorithm which generally uses both reference measurement data which was captured while switching read-out gradients with a positive polarity and reference measurement data which was captured while switching read-out gradients with a negative polarity for reducing artifacts such as image ghosts or wrap-around artifacts in image data reconstructed from measurement data captured using an EPI acquisition technique. This may e.g. be a dual-polarity GRAPPA (DPG) algorithm, as is described for example in the article by Hoge et al., "Dual-Polarity GRAPPA for Simultaneous Reconstruction and Ghost Correction of Echo Planar Imaging Data", Magn. Reson. Med. 76: pp. 32-44, 2016, which likewise uses reference measurement data to be assigned to the respective polarities.

For example, it is known for parallel acquisition techniques to capture reference measurement data for completing missing measurement data using a GRE capture technique in which the reference measurement data is captured at least from a central region of the k-space for each slice for which image data is to be generated with a plurality of excitations of a GRE measurement, with precisely one gradient echo with suitable phase encoding being captured after each excitation. Such prior art reference measurement data is not suitable for use in the course of a DP algorithm since it is only captured with a constantly identical polarity of the read-out gradient used.

The disclosure is based on the recognition that items of reference data captured using a GRE capture technique with different polarities of the read-out gradients implicitly have a high level of consistency with one another, since all the reference measurement data can be captured in rapid sequence using GRE, and thus in an overall short measurement time and thus just one short phase evolution takes place during the measurement time. Complex preprocessing steps for ensuring the greatest possible consistency of the sorted sets of reference measurement data which have hitherto been required when sorting reference measurement data sets for DPG algorithms captured using an EPI technique can thus be omitted, because items of reference measurement data captured with the method according to the disclosure are already consistent in themselves, and therefore for each polarity of the read-out gradients a set of fully sampled reference measurement data is available which is already suitable for carrying out a DP algorithm without any further measures.

If the reference measurement data for both polarities is in each case captured in immediately successively occurring captures of the GRE capture technique, e.g. low sensitivity to effects of (physiological) movements of the object under examination is furthermore obtained, and therefore, despite a possibly occurring movement of the object under examination and/or despite a possibly occurring change in ambient conditions during the reference measurement data captures, a very high level of consistency between the two sorted sets of reference measurement data is also obtained.

In comparison with reference measurement data captured with a single-shot EPI acquisition technique, the reference measurement data of the first and the second set of reference measurement data described herein is insensitive to nonuniformities in the main magnetic field B0 and can be captured in a markedly shorter measurement time.

In comparison with reference measurement data captured with a multi-shot EPI acquisition technique, the reference measurement data of the first and second sets of reference measurement data described herein is also insensitive to nonuniformities in the main magnetic field B0, can be captured in a markedly shorter measurement time, and is insensitive to the effects of (physiological) movements. The latter-stated advantage is less marked if a multi-shot EPI acquisition technique was used together with a FLEET technique, but the reference measurement data of the first and second sets of reference measurement data described herein is not impaired by variations in contrast in comparison with reference measurement data captured using a FLEET technique.

A magnetic resonance system according to the disclosure comprises a magnet unit, a gradient unit, a radio-frequency unit, and a control device configured to carry out a method according to the disclosure and having a reference measurement data unit.

A computer program according to the disclosure implements a method according to the disclosure on a control device when it is executed on the control device. The computer program for example comprises commands which, on execution of the program by a control device, e.g., a control device of a magnetic resonance system, causes this control device to carry out a method according to the disclosure. The control device may take the form of a computer.

The computer program may here also take the form of a computer program product which can be loaded directly into a memory of a control device, having program code means for carrying out a method according to the disclosure when the computer program product is executed in a computing unit of the computer system.

A computer-readable storage medium according to the disclosure comprises commands which, on execution by a control device, for example a control device of a magnetic resonance system, cause the latter to carry out a method according to the disclosure.

The computer-readable storage medium may take the form of an electronically readable data storage medium which comprises electronically readable control information stored thereon, which comprises at least one computer program according to the disclosure and is configured in such a way as to carry out a method according to the disclosure when the data storage medium is used in a control device of a magnetic resonance system.

The advantages and explanations stated in relation to the method also apply analogously to the magnetic resonance system, the computer program product, and the electronically readable data storage medium.

BRIEF DESCRIPTION OF THE DRAWINGS

Further advantages and details of the present disclosure are revealed by the exemplary embodiments described below and with reference to the drawings. The stated examples do not limit the disclosure. In the figures:

FIG. 1 illustrates an example schematic flow diagram of a method, in accordance with the disclosure;

DETAILED DESCRIPTION OF THE DISCLOSURE

FIG. 1 is a schematic flow diagram of a method according to the disclosure for reducing artifacts in image data BD reconstructed from measurement data MD+− of an object under examination captured using an EPI acquisition technique.

In this method, measurement data MD+− is loaded that was generated by generating a train of at least two echo signals from at least one slice of an object under examination to be examined after in each case one RF excitation pulse and capturing the echo signals while switching read-out gradients A with alternating polarity for successive echo signals. The echo signals captured for the at least one slice were acquired (block 301) as measurement data MD+−, for example in a measurement data set.

Figure 2:
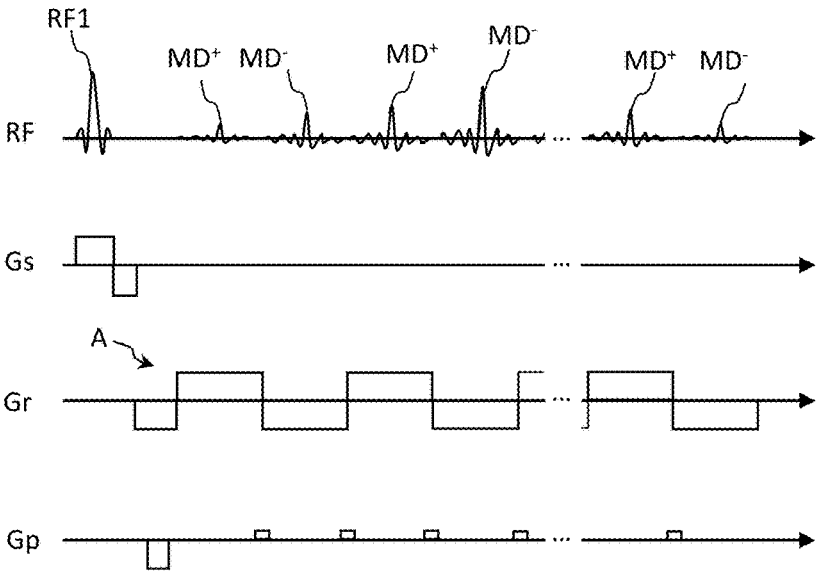
FIG. 2 shows a portion of an example pulse sequence scheme for capturing measurement data for imaging using an EPI technique, in accordance with the disclosure.

FIG. 2 shows one possible pulse sequence scheme for capturing such measurement data MD+− for imaging using an EPI acquisition technique. The top line RF depicts RF pulses to be irradiated and generated echo signals, the second line Gs gradients to be switched in the slice selection direction, the third line Gr gradients to be switched in the read-out direction, and the bottom line Gp gradients to be switched in the phase-encoding direction.

Following an RF excitation pulse RF1 by a read-out gradient A with alternating polarity (as conventional in EPI techniques), a train of echo signals is generated from the at least one excited slice which are captured and acquired as measurement data MD+, MD−. Due to the alternating polarity of the read-out gradient A, measurement data MD+ with a positive polarity of the read-out gradient and measurement data MD− with a negative polarity of the read-out gradient is alternately acquired in the example shown. The resultant problems were already explained above in the text. The RF excitation pulse RF1 may here excite just one slice of the object under examination or the RF excitation pulse RF1 may be a spatially non-selective RF excitation pulse or a spatially (three-dimensionally) selective RF excitation pulse that excites a three-dimensional excitation volume. It is, however, also conceivable for the excitation pulse RF1 to be a multi-band RF excitation pulse which simultaneously excites at least two slices, such that the measurement data MD+− is captured in collapsed form for the at least two slices. Such measurement data MD+− captured in collapsed form can be separated in known manner into individual slice measurement data MD+− of the at least two simultaneously excited slices.

FIG. 2 shows by way of example a pulse sequence scheme for imaging using a single-shot gradient echo EPI. This should not be understood restrictively: the method described herein is suitable for any desired EPI acquisition techniques, for example including for multi-shot EPI acquisition techniques, spin echo EPI acquisition techniques, spin echo EPI acquisition techniques, dual spin echo EPI acquisition techniques, stimulated-echo EPI acquisition techniques, gradient echo EPI acquisition techniques or indeed GRASE (gradient and spin echo) EPI acquisition techniques.

A first set of reference measurement data RD+ for reducing artifacts is captured (block 303) for the at least one slice using a GRE acquisition technique, wherein the reference measurement data RD+ of the first set of reference measurement data RD+ is captured after a plurality of excitations with different phase encoding and in each case while switching identically configured read-out gradients which have a first polarity. The first polarity may here be positive or negative.

A second set of reference measurement data RD+ for reducing artifacts is captured (block 303') for the at least one slice using a GRE acquisition technique, wherein the reference measurement data RD− of the second set of reference measurement data RD− is captured after a plurality of excitations with different phase encoding and in each case while switching identically configured read-out gradients which have a second polarity differing from the first polarity. Using a GRE acquisition technique permits robust generation of (implicitly) consistent, fully sampled reference measurement data, wherein "fully sampling" should here be taken to mean capturing the reference measurement data using k-space sampling with a density which fulfils the Nyquist condition, or capturing reference measurement data which is per se undersampled according to Nyquist but has been supplemented using an appropriate completion technique to obtain a set of reference measurement data which is complete according to Nyquist. Thus, for example, even reference measurement data in the k-space for which a peripheral region of the k-space (for example along the phase-encoding direction) was not sampled, for example to save time, should be taken to be "fully sampled" (as is conventional for example in the course of partial Fourier techniques). The same applies to reference measurement data in the k-space for which neither peripheral region (e.g. in the phase-encoding direction) was sampled, whereby for example the resolution of the reference measurement data is reduced.

Figure 3:
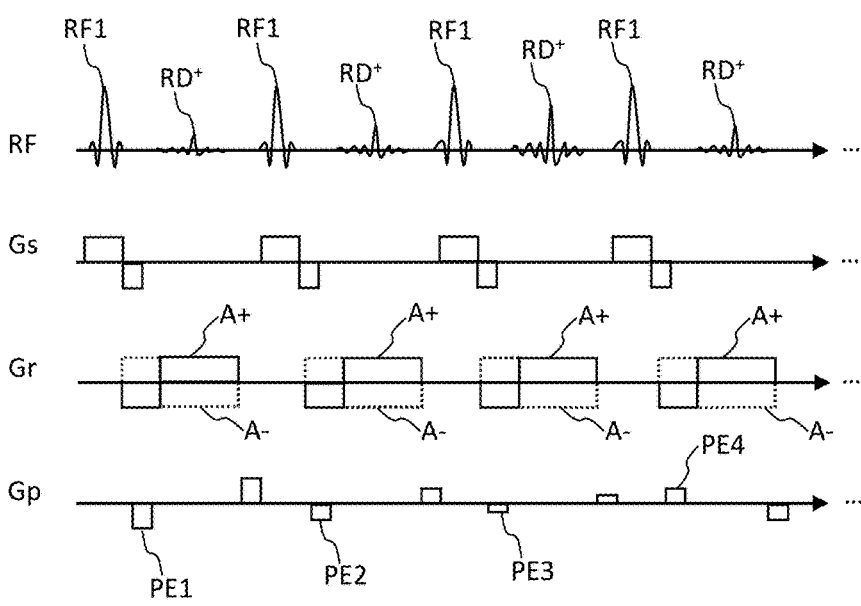
FIGS. 3-5 show portions of an example pulse sequence schemes for capturing reference measurement data, in accordance with the disclosure.
Figure 4:
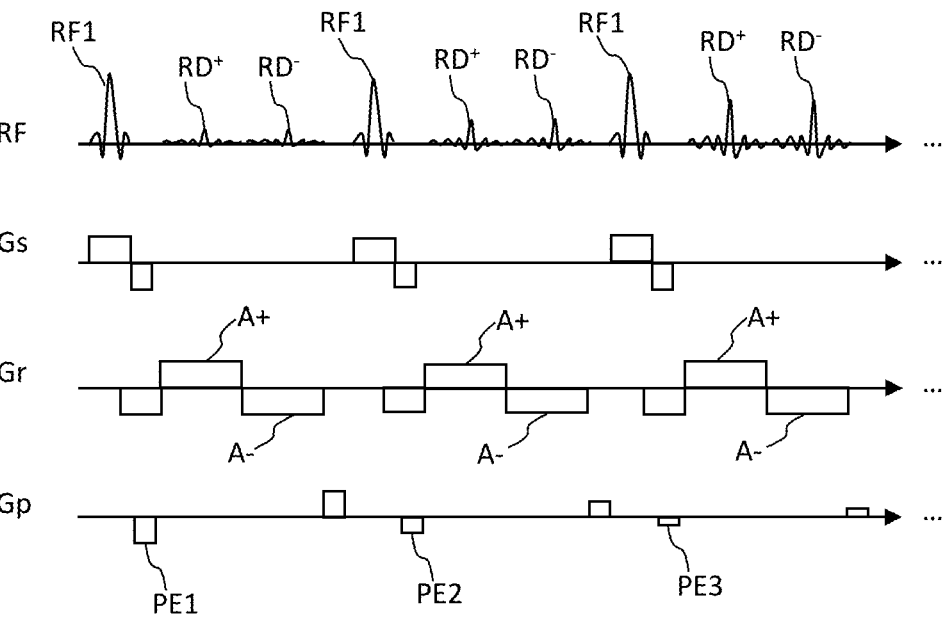
Figure 5:
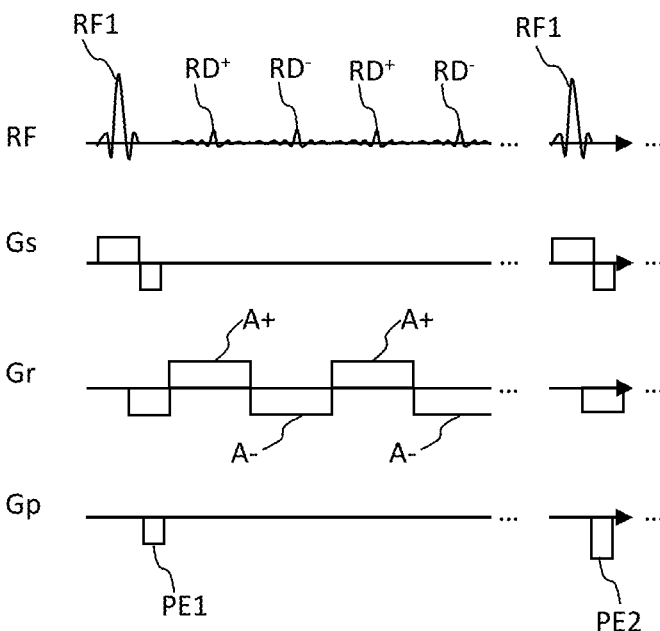

FIGS. 3 to 5 further below describe exemplary possible pulse sequence schemes of GRE acquisition techniques for capturing reference measurement data RD+, RD− for a slice, the top line RF in each case again depicting RF pulses to be irradiated and generated echo signals, the second line Gs gradients to be switched in the slice selection direction in order to define the slice to be measured, the third line Gr gradients to be switched in the read-out direction, and the bottom line Gp gradients to be switched in the phase-encoding direction.

Calibration data KD is determined (block 305) on the basis of captured first sets of reference measurement data RD+ and of captured second sets of reference measurement data RD−. The calibration data KD is determined in a manner known per se in the course of dual-polarity techniques in each case on the basis of the respective captured sets of reference measurement data RD+, RD−.

It is also conceivable for first calibration data KD+ to be determined (block 305'') on the basis of captured first sets of reference measurement data RD+, and for second calibration data KD− to be determined (block 305') on the basis of captured second sets of reference measurement data RD−. In this manner, specific calibration data KD+, KD− is in each case determined for the two polarities, the first and the second calibration data KD+, KD− in turn being determined in a manner known per se in the course of dual-polarity techniques in each case on the basis of the respective captured sets of reference measurement data.

It is conceivable for the measurement data MD+− to have been generated using a saturation technique, for example a fat saturation technique, and/or a spectrally selective excitation technique, for example a water excitation technique, such that the captured echo signals originate spectrally selectively from a spin species, e.g. water spin, defined by the saturation technique and/or spectrally selective excitation technique. For instance, in the case of such spectrally selective generation of the measurement data MD+−, it is possible to use a saturation technique and/or a spectrally selective excitation technique when capturing the first and second sets of reference measurement data RD+, RD−, such that the captured reference measurement data of the first and second sets of reference measurement data RD+, RD− also originates spectrally selectively from the same spin species as the echo signals from which the measurement data MD+− was generated. It is not necessary here for the same saturation technique or spectrally selective excitation technique to be used in each case, but instead a further improvement in the consistency of the reference measurement data of the first and second sets of reference measurement data RD+, RD− of the measurement data MD+− captured for imaging can also be achieved in a different manner in the captures of the reference measurement data and the echo signals of the measurement data MD+− simply by defining the same spin species.

Specific calibration data KD, KD+, KD− is used (block 307) in the course of a DP algorithm for correcting artifacts in image data BD of at least one slice reconstructed from the measurement data MD+− captured for the at least one slice, which artifacts are caused by errors in the measurement data.

For instance, errors in the measurement data MD+− may be corrected in the k-space in the course of the DP algorithm, whereby corrected measurement data MDk is determined from which the image data BD can be reconstructed.

It is also possible for artifacts in image data BD+− reconstructed from the measurement data MD+− and caused by errors in the measurement data MD+− to be corrected by the DP algorithm in the image space, whereby corrected image data BD is determined.

Selection of the type of calibration data KD, KD+, KD− determined and of the space in which correction occurs may depend on the type of DP algorithm used.

The corrected measurement data MDk and/or image data BD can be saved and/or further processed.

FIG. 3 shows a portion of a pulse sequence scheme for capturing reference measurement data using a GRE capture technique. In each case, after an RF excitation pulse RF1, an echo signal can here be generated from a slice of the object under examination, which signal is in each case captured as reference measurement data RD+ while switching a read-out gradient A+ along a k-space line, the generated echo signals being spatially encoded with different phase-encoding schemes by switching various gradients in the phase-encoding direction PE1, PE2, PE3, PE4, such that the reference measurement data RD+ is captured along k-space lines shifted relative to one another in the phase-encoding direction. The number of excitations using in each case one RF excitation pulse RF1 and the different phase-encoding schemes PE1, PE2, PE3, and PE4 may be selected in such a way that, overall, a desired set of reference measurement data RD+ is captured.

The measurements performed are repeated with read-out gradients A− in the read-out direction (shown by dotted lines), the polarity of which differs from the polarity of the read-out gradients A+, but otherwise with identical gradients and RF excitation pulses, whereby a set of reference measurement data RD− (not shown) is captured.

Thus, in a first measurement for capturing a first set of reference measurement data, only reference measurement data RD+ with a first, for example positive, polarity of the read-out gradients used can be captured and, in a second (separate) measurement for capturing a second set of reference measurement data, only reference measurement data RD− with a second, for example negative, polarity of the read-out gradients used can be captured. In this manner, it is possible to ensure that both sets of reference measurement data (and all the captured reference measurement data RD+ and RD−) have an identical echo time TE. The two stated measurements may here be captured in succession or also nested in one another.

FIG. 4 shows a portion of a pulse sequence scheme for capturing reference measurement data using a dual-echo GRE capture technique, in which, after an RF excitation pulse RF1, two echo signals are generated by alternating read-out gradients. In each case, an echo signal generated first after the RF excitation pulse RF1 while switching a first read-out gradient A+ of a first polarity in a first direction along a k-space line is in each case captured as reference measurement data RD+, and a second echo signal in each case generated while switching a second read-out gradient A− of a second polarity differing from the first polarity is in each case captured in a second direction along the same k-space line as reference measurement data RD−. The generated first and second echo signals may here again be spatially encoded with different phase-encoding schemes by switching various gradients in the phase-encoding direction PE1, PE2, PE3, such that the reference measurement data RD+ and RD− is captured along k-space lines shifted relative to one another in the phase-encoding direction. The number of excitations using in each case one RF excitation pulse RF1 and the different phase-encoding schemes PE1, PE2, and PE3 may again be selected in such a way that, overall, a desired first set of reference measurement data RD+ and a desired second set of reference measurement data RD− are captured.

Reference measurement data RD+, RD− of the first set of reference measurement data RD+ and the second set of reference measurement data RD− may accordingly be captured with the same phase encoding after a common excitation during two immediately successive read-out gradients of the first and second polarities.

Such a capture of the two sets of reference measurement data using a dual-echo GRE capture technique can be carried out in a shorter time than a capture of the two sets of reference measurement data according to a pulse sequence scheme according to FIG. 3, since the reference measurement data RD− of the second set of reference measurement data RD− is captured without separate excitation immediately after capture of reference measurement data RD+ of the first set of reference measurement data RD+ by supplementing a further read-out gradient A−after each excitation with an RF excitation pulse RF1. Reference measurement data RD+ of the first set of reference measurement data RD+ and reference measurement data RD− of the second set of reference measurement data RD− captured in this way do, however, have different echo times TE.

FIG. 5 shows a portion of a pulse sequence scheme for capturing reference measurement data RD+, RD− using a multi-echo GRE capture technique in which, after an RF excitation pulse RF1, a plurality of, for example three, four, five, or more echo signals are generated by alternating read-out gradients A+, A−. In each case, an echo signal generated first after the RF excitation pulse RF1 and each further uneven echo signal generated while switching a first read-out gradient A+ of a first polarity in a first direction along a k-space line may in each case be captured as reference measurement data RD+, and a second echo signal and each further even echo signal in each case generated while switching a second read-out gradient A− of a second polarity differing from the first polarity may in each case be captured in a second direction along the same k-space line as reference measurement data RD−. The generated first and second echo signals may here again be spatially encoded with different phase-encoding schemes by switching various gradients in the phase-encoding direction PE1, PE2, such that the reference measurement data RD+ and RD− is captured along k-space lines shifted relative to one another in the phase-encoding direction. The number of excitations using in each case one RF excitation pulse RF1 and the different phase-encoding schemes PE1 and PE2 may again be selected in such a way that, overall, a desired first set of reference measurement data RD+ and a desired second set of reference measurement data RD− is captured.

Reference measurement data RD+, RD− of the first set of reference measurement data RD+ and the second set of reference measurement data RD− may accordingly be repeatedly captured with the same phase encoding after a common excitation during at least three immediately successive read-out gradients of the first and second polarities and at least for one of the two sets of reference measurement data RD+, RD−.

It is thus conceivable for reference measurement data RD+, RD− of the first set of reference measurement data RD+ and/or of the second set of reference measurement data RD− to be captured with the same phase encoding after a common excitation at least twice with an identical polarity, such that at least two sets of reference measurement data RD+, RD− of the same kind (identical polarity and identical spatial encoding, for example the same k-space line) are captured.

Such capture of the two sets of reference measurement data using a multi-echo GRE capture technique requires (like the example of the dual-echo GRE acquisition technique described with reference to FIG. 4) fewer excitations for capturing the two sets of reference measurement data than capture of the two sets of reference measurement data according to a manner described with reference to FIG. 3. Such capture of the two sets of reference measurement data using a multi-echo GRE acquisition technique moreover permits further freedoms.

If the two sets of reference measurement data are for example captured with a triple-echo GRE acquisition technique in which three echo signals are generated, and in each case the third generated echo signal is captured with a read-out gradient of the same polarity as the first generated echo signal, the two sets of reference measurement data of the same kind, which were captured by reference measurement data capture during the first and the third generated echo signal, can be combined into a combined set of reference measurement data, whereby even better consistency of the reference measurement data may be achieved. Combining sets of reference measurement data of the same kind in this way may for instance be carried out in the course of determining associated calibration data (block 305 or 305') or upstream of calibration data determination.

The two sets of reference measurement data of the same kind may here be combined, for instance, by averaging (for example in a similar manner to that described for navigator data in the previously cited U.S. Pat. No. 6,043,651), in such a way that the combined set of reference measurement data has a virtual echo time TE which effectively corresponds to the echo time TE of the reference measurement data captured during the second echo signal.

It is thus possible to combine at least two sets of reference measurement data of the same kind in such a way that at least one combined set of reference measurement data has a virtual echo time which effectively corresponds to an echo time of a set of reference measurement data which was captured with read-out gradients of another polarity than the reference measurement data of the combined sets of reference measurement data. Even better consistency of the reference measurement data can accordingly be achieved.

Alternatively, the (in each case) first generated echo signal of a triple-echo GRE acquisition technique can be ignored and just the (in each case) second and third generated echo signals can be captured as reference measurement data RD+, RD− (very similarly to dual-echo GRE acquisition). In this manner, it can be ensured that the echo signals used for capturing the sets of reference measurement data RD+, RD− are "more similar" to most of the echo signals of the echo train which were captured as measurement data MD+−. This is for instance the case if, during capture of the measurement data MD+−, transient phenomena bring about effects which cause changes in the captured measurement data, above all changes in the signal phases, over the captured EPI echo train. Such effects may be caused, for example, by resonance effects of the gradient unit of the magnetic resonance system used. In addition, the gradients switched before a first echo signal of a triple-echo GRE acquisition technique (for example for slice selection, phase encoding and/or for pre-phasing the read-out gradients) may generate interference or eddy currents and thus influence first echo signals more strongly or differently than other echo signals generated later after the common excitation, whereby first echo signals might be considered to be particularly "unrepresentative" of most of the echo signals of the EPI echo train with which the measurement data MD+− was captured.

If at least two sets of reference measurement data of the same kind have been captured, the temporally first captured set of reference measurement data of the at least two sets of reference measurement data of the same kind can also be discarded. In this manner, it is possible to achieve similar advantages to those achieved by ignoring echo signals generated first after excitation, as described above.

If in addition one or further echo signals are added by further alternating read-out gradients after a common RF excitation pulse RF1, quadruple- or quintuple-echo GRE acquisition techniques (etc.) are obtained.

Similarly to the possibilities described with regard to triple-echo GRE acquisition techniques, reference measurement data can also be captured or taken into account for such multi-echo GRE acquisition techniques either from only individual (for example, in each case the final two) echo signals after a common excitation and/or, if at least two sets of reference measurement data of the same kind have been captured, these can be combined into a combined set of reference measurement data.

For example, in a quadruple-GRE acquisition technique an in each case first echo signal after excitation could be ignored, and sets of reference measurement data of the same kind captured during an (in each case) second and fourth echo signal could be averaged to form a combined set of reference measurement data. Reference measurement data of such a combined set of reference measurement data can (as described above) have a virtual echo time TE which effectively corresponds to an echo time TE of the reference measurement data of a second set of reference measurement data which was captured during the third echo signal after the common excitation. First calibration data can then be determined on the basis of the reference measurement data of the combined set of reference measurement data for a first polarity and second calibration data can then be determined on the basis of the reference measurement data (effectively with the same echo time TE) of the second set of reference measurement data for a second polarity.

By ignoring the first echo signals, the captured reference measurement data is, as described above, more representative of the echo signals in an EPI echo train with which the measurement data MD+− was captured.

In the simplest case, characteristics (e.g. constant amplitude duration, amplitude, ramp times, rates of rise and fall, etc.), other than the specified polarity, of the read-out gradients used for captures of the reference measurement data of the two sets of reference measurement data can be selected independently of the alternating read-out gradients of the EPI technique which was used for capturing the measurement data MD+−. In this manner, maximum flexibility is obtained when setting the parameters for the reference measurement data and this data may be captured for example with reduced resolution and thus very rapidly, in a short measurement time.

In general, to improve the consistency of the measurement data MD+− and of the captured reference measurement data, the read-out gradients used on capture of the first set of reference measurement data and the second set of reference measurement data may be selected in such a way that they are as similar as possible, e.g. identical, to the read-out gradients which were used on acquisition of the measurement data MD+− with regard to at least one of the parameters from the group of magnitude of amplitude, rate of rise, constant amplitude duration, rate of fall, read-out bandwidth, resolution in the read-out direction, positioning of a capture window which is used relative to the read-out gradient (for example for "ramp sampling" in which capture of the (reference) measurement data is begun while the read-out gradient is still rising), echo symmetry (for example in conjunction with partial Fourier techniques in the read-out direction), etc.

The more similar the selected characteristics of the read-out gradients that are used on capture of the reference measurement data are to the characteristics of the read-out gradients of the EPI technique with which the measurement data MD+− was captured, or the more these characteristics are selected to be maximally similar, the greater the possible improvements in the achievable consistency between the captured reference measurement data and the measurement data MD+−. For maximum consistency, the parameters and thus characteristics of the read-out gradients for the reference measurement data captures may be selected to be completely identical to those of the EPI technique with which the measurement data MD+− was captured.

If the characteristics of the read-out gradients used for the reference measurement data are identical to those used for the measurement data MD+−, pre-processing steps, such as for example correction methods, applied to the measurement data MD+− can be applied identically to the reference measurement data RD+, RD−. Pre-processing steps which may here be considered are, for example, include corrections of a variable sampling density during ramp sampling and/or corrections of asymmetries between positive and negative read-out gradients (for example based on navigator data) as already mentioned above.

Pre-processing steps, e.g. correction methods, which are applied before application of the first and/or second calibration data to the measurement data MD+− in the course of the DP algorithm may thus also similarly be applied to the first set of reference measurement data RD+ and/or the second set of reference measurement data RD−before determination of the first and second calibration data KD+, KD− (block 305 or block 305').

A phase correction method may be applied to the first set of reference measurement data RD+ and/or the second set of reference measurement data RD− to adjust the phase evolution of the reference measurement data RD+, RD− of the sets of reference measurement data RD+, RD− to those of the measurement data MD+−. Using such phase correction methods, it is possible to reduce differences in the phase evolution of the reference measurement data RD+, RD− (captured with a gradient echo measurement and a short echo time) and in the phase evolution of the measurement data MD+− captured for imaging using an EPI technique (captured with an EPI measurement and longer echo time) when the spatial distribution of the main magnetic field B0 is known. Such a phase correction method is described for example in German patent application no. DE 10 2016 200889 B4. A further improvement in the consistency of reference measurement data RD+, RD− and measurement data MD+− concomitant with such a phase correction method can lead to even better quality of the artifact reduction results.

It is conceivable for the measurement data MD+− to be incompletely captured within the slice plane according to a parallel acquisition technique, for example GRAPPA, and for the first set of reference measurement data RD+ and the second set of reference measurement data RD− additionally to be used as reference measurement data in the course of the parallel acquisition technique for completing the uncaptured data, since captured reference measurement data of the first and second sets of reference measurement data RD+, RD− is inherently suitable for such a use in the course of parallel acquisition techniques. First and second calibration data KD+, KD− can e.g. be determined from the first and second sets of reference measurement data RD+, RD− for such use in the course of a parallel acquisition technique precisely if the measurement data MD+− is to be completed specifically according to the polarity with which they were in each case captured. There is no need to capture further reference measurement data specifically for the parallel acquisition technique. For instance, even if the whole k-space was fully sampled according to Nyquist, measurement data MD+− captured using an EPI acquisition technique may in each case be considered to be incomplete per polarity of the read-out gradients used on capture of the measurement data MD+−, since in each case only every second row was captured with the same polarity of the associated read-out gradient, and therefore a parallel acquisition technique using the reference measurement data RD+, RD− of the two sets of reference measurement data RD+, RD− can be used in order to generate respective completed sets of measurement data for each polarity.

The acquired measurement data MD+− may also be captured simultaneously and thus in collapsed form for at least two slices using a slice multiplexing technique and the generated sets of reference measurement data RD+, RD− may be used in the course of separating the measurement data captured in collapsed form into measurement data MD+− of the individual slices (for example in a known manner stated above, for example using a slice-GRAPPA method). First and second calibration data KD+, KD− can for instance be determined from the first and second sets of reference measurement data RD+, RD− for such use in the course of separating measurement data MD+− captured in collapsed form, precisely if the measurement data MD+ is to be separated into measurement data of the individual slices specifically according to the polarity with which they were in each case captured. Capturing further reference measurement data specifically for separation of the measurement data MD+− captured in collapsed form can be omitted.

Using the method described herein, it is thus possible to significantly increase the consistency of flawed measurement data MD+− captured using an EPI acquisition method with reference measurement data captured for use in the course of a DP algorithm, despite different acquisition techniques during capture of the reference measurement data and the measurement data MD+− (GRE vs. EPI), such that a reduction in artifacts is possible with higher quality using the DP algorithm despite a shorter measurement time.

Imaging methods in which the duration of capture of the measurement data MD+− is very short in particular benefit from the capture of reference measurement data according to a method described herein in first and second sets of reference measurement data. The shorter this capture duration, the greater the weight (relatively speaking) of the time for capturing the reference measurement data. For example, in typical clinical magnetic resonance systems it is possible to carry out, for instance, diffusion-weighted imaging of the entire head using single-shot EPI (with an SMS factor of 2 and an (in-plane) GRAPPA factor of 2) within 4 repetitions (1× without diffusion weighting, 3× with diffusion weighting along orthogonal directions) with a repeat time TR of 3 seconds in a total of 4×3=12 seconds. A further "dummy repetition" and thus a further repeat time TR may optionally be necessary for establishing an equilibrium state of the magnetization, such that in total 5×3=15 seconds is required for the duration of the entire measurement. Conventional techniques require 6-12 seconds for a hitherto known capture of reference measurement data using an EPI capture technique for use in the course of a DP algorithm. The conventional techniques require a further 3-6 seconds for a hitherto known capture of further reference measurement data using a GRE or an EPI acquisition technique for completing uncaptured measurement data within a slice (if it does not proceed in the course of the DG algorithm) and/or, if measurement data from a plurality of slices was captured in collapsed form, for separation (slice deconvolution) of the measurement data captured in collapsed form into measurement data of the individual slices. Overall, capture of all the required reference measurement data thus takes 9-18 seconds in the prior art and thus almost as long as capture of the measurement data for imaging.

The reference measurement data of both sets of reference measurement data can be captured in 4-7 seconds with a method according to the disclosure. If this reference measurement data is used not only for the DP algorithm, but optionally also for slice deconvolution, the total duration of the measurements to be carried out is reduced from 15 seconds plus 9-18 seconds, i.e., 24-33 seconds, to just 15 seconds plus 4-7 seconds, i.e., 19-26 seconds, which corresponds to a reduction in the required measurement time of approx. 20%.

The disclosure successfully makes the advantages of reference measurement data captured using a GRE acquisition technique (for example short measurement times, low sensitivity to movement, etc.) usable for DP algorithms and so enables the achievement of improved quality of image data reconstructed from the measurement data MD+−, e.g. a reduction in image ghosts and/or wrap-around artifacts.

The items of reference measurement data captured according to the disclosure are implicitly consistent in themselves and may additionally also be used in the course of parallel acquisition techniques for compensating in-plane undersampling (for example with GRAPPA) and/or for separating measurement data captured in collapsed form for a plurality of slices into measurement data for individual slices, are robust against movements of the object under examination, insensitive to nonuniformities in the main magnetic field B0 and permit elevated flexibility in the selection of capture parameters, e.g. resolution.

Figure 6:
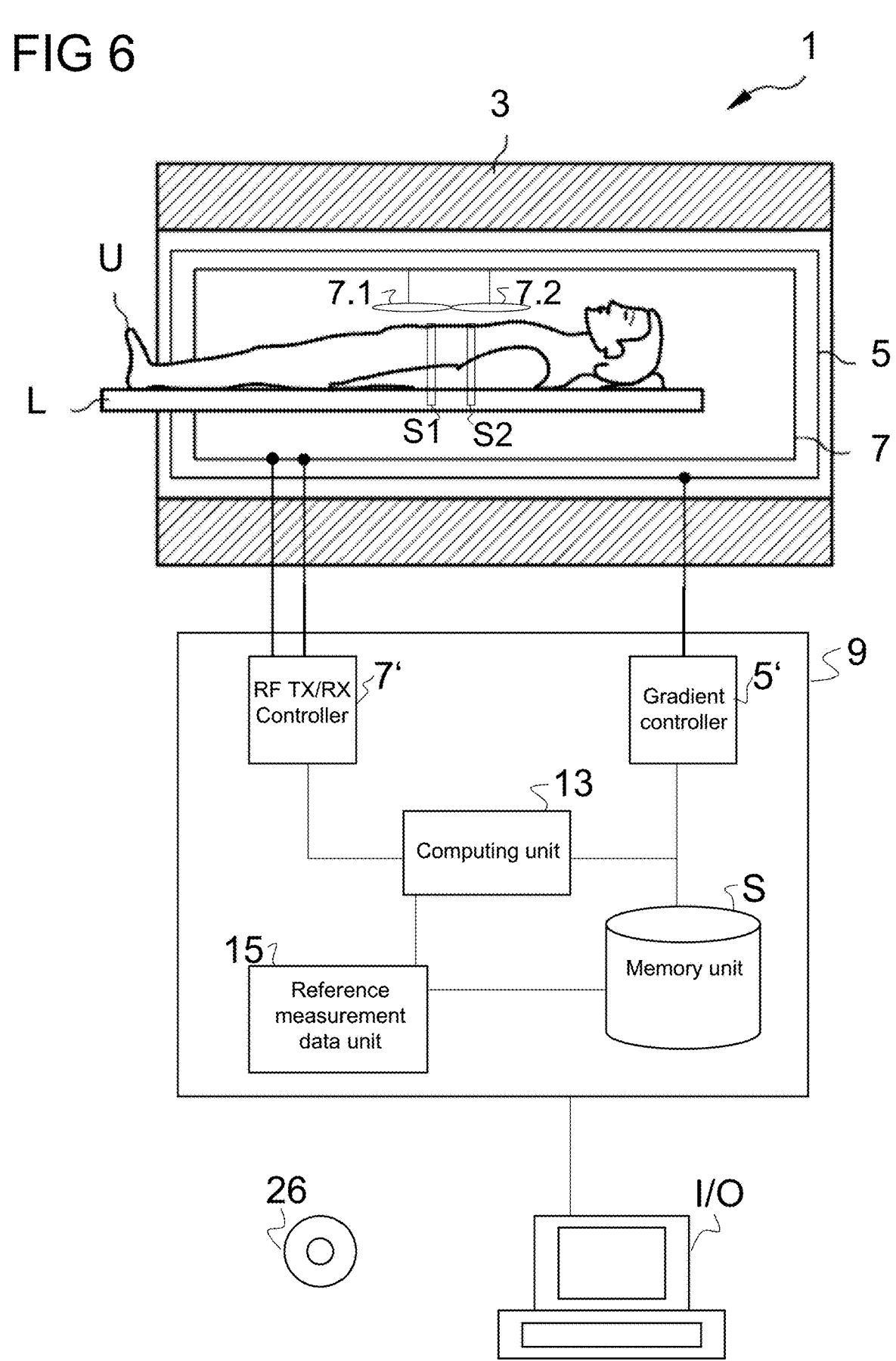
FIG. 6 shows a diagram of a magnetic resonance system, in accordance with the disclosure.

FIG. 6 is a schematic diagram of a magnetic resonance system 1 according to the disclosure. This comprises a magnet unit 3 for generating the main magnetic field, a gradient unit 5 for generating the gradient fields, a radio-frequency (RF) unit 7 for irradiating and receiving RF signals and a control device 9 configured to carry out a method according to the disclosure.

FIG. 6 is merely a diagrammatic representation of these subunits of the magnetic resonance system 1. For instance, the RF unit 7 may comprise a plurality of subunits, for example of a plurality of coils (like the diagrammatically represented coils 7.1 and 7.2) or more coils, which may be designed either only for transmitting RF signals or only for receiving the triggered RF signals, or for both.

In order to examine an object under examination U, for example a patient or indeed a phantom, this can be introduced on a couch L into the measuring volume of the magnetic resonance system 1. The diagrammatically depicted slices S1 and S2 are examples of slices of a target volume of the object under examination, which are to be captured individually or also simultaneously (using a slice multiplexing-method), from which echo signals can be captured and acquired as measurement data.

The control device 9 serves to control the magnetic resonance system 1 and can for example control the gradient unit 5 using a gradient controller 5' and the RF unit 7 using a RF transmit/receive controller 7'. The RF unit 7 may here comprise a plurality of channels on which signals can be transmitted or received.

The RF unit 7, together with its RF transmit/receive controller 7', is responsible for generating and irradiating (transmitting) a RF alternating magnetic field for manipulating spins in a region to be manipulated (for example in slices S to be measured) of the object under examination U. The center frequency of the RF alternating magnetic field, which is also known as the B1 field, is usually set such that it is as close as possible to the resonant frequency of the spins to be manipulated. Deviations of the center frequency from the resonant frequency are known as off-resonance. Currents controlled using the radio-frequency transmit/receive controller 7' are applied to the RF coils in the radio-frequency unit 7 in order to generate the B1 field.

The control device 9 furthermore comprises a reference measurement data unit 15 with which a capture according to the disclosure of reference measurement data can be controlled. The control device 9 is configured overall to carry out a method according to the disclosure.

A computing unit 13 comprised by the control device 9 is configured to carry out all the computing operations necessary for the required measurements and determinations. Intermediate and final results required or ascertained for this purpose can be saved in a memory unit S of the control device 9. The illustrated units should not necessarily be understood as physically separate units, but merely represent a subdivision into units of meaning which may, however, also be embodied in fewer or even just one single physical unit.

Control commands can be sent, for example by a user, to the magnetic resonance system 1 and/or results from the control device 9, for example in the form of image data, can be displayed via an input/output device I/O of the magnetic resonance system.

A method described herein may also assume the form of a computer program which comprises commands which carry out the described method on a control device 9. A computer-readable storage medium may likewise be present which comprises commands which, on execution by a control device 9 of a magnetic resonance system 1, cause the latter to carry out the described method.

Independent of the grammatical term usage, individuals with male, female or other gender identities are included within the term.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units or subunits, as applicable and relevant, may alternatively be referred to herein as "circuitry," "controllers," "processors," or "processing circuitry," or alternatively as noted herein.

What is claimed is:

1. A method for reducing artifacts in image data reconstructed from measurement data of an object under examination captured using an echo-planar acquisition technique, comprising:

loading measurement data that was generated by:

generating a train of at least two echo signals from at least one slice of the object under examination, in each case, after an RF excitation pulse;

capturing the echo signals while switching read-out gradients with alternating polarity for successive echo signals; and acquiring the captured echo signals as the measurement data;

capturing, for the at least one slice of the object under examination, a first set of reference measurement data for reducing artifacts using a gradient echo (GRE) acquisition technique, wherein the first set of reference measurement data is captured after a plurality of excitations with different phase encoding and, in each case, while switching identically configured read-out gradients having a first polarity;

capturing, for the at least one slice of the object under examination, a second set of reference measurement data for reducing artifacts using the GRE acquisition technique, wherein the second set of reference measurement data is captured after a plurality of excitations with different phase encoding and, in each case, while switching identically configured read-out gradients having a second polarity differing from the first polarity;

determining first and second calibration data based upon the captured first and second sets of reference measurement data, respectively;

applying the first calibration data and the second calibration data in the course of a dual-polarity GRAPPA (DPG) algorithm to correct artifacts in the image data reconstructed from the measurement data caused by errors in the measurement data by to generate corrected image data.

2. The method as claimed in claim 1, wherein the first set of reference measurement data and the second set of reference measurement data are captured with the same phase encoding after a common excitation during two immediately successive read-out gradients of the first and the second polarity.

3. The method as claimed in claim 2, wherein the first set of reference measurement data and/or the second set of reference measurement data is captured with the same phase encoding after a common excitation performed at least twice with an identical polarity such that at least two sets of reference measurement data of the same kind are captured.

4. The method as claimed in claim 3, wherein the at least two sets of reference measurement data of the same kind are combined into at least one combined set of reference measurement data.

5. The method as claimed in claim 4, wherein the at least two sets of reference measurement data of the same kind are combined such that the at least one combined set of reference measurement data has a virtual echo time that corresponds to an echo time of a set of reference measurement data that was captured with read-out gradients of a polarity other than the reference measurement data.

6. The method as claimed in claim 3, wherein when at least two sets of reference measurement data of the same kind have been captured, a temporally first captured set of reference measurement data of the at least two sets of reference measurement data of the same kind is discarded.

7. The method as claimed in claim 1, wherein the read-out gradients used to capture the first set of reference measurement data and the second set of reference measurement data are selected such that the first set of reference measurement data and the second set of reference measurement data are identical to the read-out gradients that were used to acquire the measurement data with respect to at least one of parameters comprising a magnitude of amplitude, a rate of rise, a duration, a rate of fall, a read-out bandwidth, a resolution in the read-out direction, a positioning of a capture window that is used relative to the read-out gradient, or an echo symmetry.

8. The method as claimed in claim 1, wherein preprocessing steps comprising correction methods that are applied to the measurement data in the course of the DPG algorithm before application of the first and/or second calibration data are also applied to the first set of reference measurement data and/or the second set of reference measurement data before a determination of the first and the second calibration data.

9. The method as claimed in claim 1, wherein when the measurement data is incompletely captured in a slice plane according to a parallel acquisition technique, the first set of reference measurement data and the second set of reference measurement data are used as reference measurement data in the course of the parallel acquisition technique for completing uncaptured data.

10. The method as claimed in claim 9, wherein the uncaptured data is completed in the course of the DPG algorithm.

11. The method as claimed in claim 1, further comprising:

applying a phase correction method to the first set of reference measurement data and/or the second set of reference measurement data to adjust a phase evolution of first set of reference measurement data and/or the second set of reference measurement data to that of the measurement data.

12. The method as claimed in claim 1, wherein the measurement data is captured using an acquisition technique comprising a multi-shot echo-planar imaging (EPI), a spin echo EPI, a dual spin echo EPI, a stimulated-echo EPI, a gradient echo EPI, or a gradient and spin echo (GRASE) EPI acquisition technique.

13. The method as claimed in claim 1, wherein the DPG algorithm corrects for errors in the measurement data in k-space and/or in image space.

14. The method as claimed in claim 1, wherein the measurement data is captured simultaneously and in a collapsed form for at least two slices using a slice multiplexing technique, and wherein the first set of reference measurement data and the second set of reference measurement data are used in the course of separating the measurement data captured in collapsed form into measurement data of individual slices of the at least two slices.

15. The method as claimed in claim 1, wherein the measurement data is generated using a fat saturation technique and/or a spectrally-selective excitation water excitation technique such that the captured echo signals originate spectrally selectively from a spin species defined by the saturation technique and/or the spectrally selective excitation technique; and when capturing the first and the second sets of reference measurement data, performing a saturation technique and/or a spectrally selective excitation technique such that the captured reference measurement data of the first and the second sets of reference measurement data originate spectrally selectively from a same spin species as the echo signals from which the measurement data was generated.

16. A magnetic resonance system, comprising:

a magnet unit; and a control device configured to reduce artifacts in image data reconstructed from measurement data of an object under examination captured using an echo-planar acquisition technique by:

loading measurement data that was generated by:

generating a train of at least two echo signals from at least one slice of the object under examination, in each case, after an RF excitation pulse;

capturing the echo signals while switching read-out gradients with alternating polarity for successive echo signals; and acquiring the captured echo signals as the measurement data;

capturing, for the at least one slice of the object under examination, a first set of reference measurement data for reducing artifacts using a gradient echo (GRE) acquisition technique, wherein the first set of reference measurement data is captured after a plurality of excitations with different phase encoding and, in each case, while switching identically configured read-out gradients having a first polarity;

capturing, for the at least one slice of the object under examination, a second set of reference measurement data for reducing artifacts using the GRE acquisition technique, wherein the second set of reference measurement data is captured after a plurality of excitations with different phase encoding and, in each case, while switching identically configured read-out gradients having a second polarity differing from the first polarity;

determining first and second calibration data based upon the captured first and second sets of reference measurement data, respectively;

applying the first calibration data and the second calibration data in the course of a dual-polarity GRAPPA (DPG) algorithm to correct artifacts in the image data reconstructed from the measurement data caused by errors in the measurement data by to generate corrected image data.

17. A non-transitory computer-readable medium having instructions stored thereon that, when executed by a control device of a magnetic resonance system, cause the magnetic resonance system to reduce artifacts in image data reconstructed from measurement data of an object under examination captured using an echo-planar acquisition technique by:

loading measurement data that was generated by:

generating a train of at least two echo signals from at least one slice of the object under examination, in each case, after an RF excitation pulse;

capturing the echo signals while switching read-out gradients with alternating polarity for successive echo signals; and acquiring the captured echo signals as the measurement data;

capturing, for the at least one slice of the object under examination, a first set of reference measurement data for reducing artifacts using a gradient echo (GRE) acquisition technique, wherein the first set of reference measurement data is captured after a plurality of excitations with different phase encoding and, in each case, while switching identically configured read-out gradients having a first polarity;

capturing, for the at least one slice of the object under examination, a second set of reference measurement data for reducing artifacts using the GRE acquisition technique, wherein the second set of reference measurement data is captured after a plurality of excitations with different phase encoding and, in each case, while switching identically configured read-out gradients having a second polarity differing from the first polarity;

determining first and second calibration data based upon the captured first and second sets of reference measurement data, respectively;

applying the first calibration data and the second calibration data in the course of a dual-polarity GRAPPA (DPG) algorithm to correct artifacts in the image data reconstructed from the measurement data caused by errors in the measurement data by to generate corrected image data.

* * * * *